(12) United States Patent
Hsieh et al.

(10) Patent No.: US 9,997,464 B2
(45) Date of Patent: Jun. 12, 2018

(54) DUMMY FEATURES IN REDISTRIBUTION LAYERS (RDLS) AND METHODS OF FORMING SAME

(71) Applicant: Taiwan Semiconductor Manufacturing Company, Ltd., Hsin-Chu (TW)

(72) Inventors: Cheng-Hsien Hsieh, Kaohsiung (TW); Li-Han Hsu, Hsin-Chu (TW); Wei-Cheng Wu, Hsin-Chu (TW); Hsien-Wei Chen, Hsin-Chu (TW); Der-Chyang Yeh, Hsin-Chu (TW); Chi-Hsi Wu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/225,024

(22) Filed: Aug. 1, 2016

(65) Prior Publication Data

US 2017/0317029 A1 Nov. 2, 2017

Related U.S. Application Data

(60) Provisional application No. 62/329,823, filed on Apr. 29, 2016.

(51) Int. Cl.
| | | |
|---|---|---|
| *H01L 23/00* | (2006.01) | |
| *H01L 23/538* | (2006.01) | |
| *H01L 23/31* | (2006.01) | |
| *H01L 21/48* | (2006.01) | |
| *H01L 21/56* | (2006.01) | |
| *H01L 25/10* | (2006.01) | |
| *H01L 25/00* | (2006.01) | |

(52) U.S. Cl.
CPC ........ *H01L 23/5386* (2013.01); *H01L 21/486* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5389* (2013.01); *H01L 25/105* (2013.01); *H01L 25/50* (2013.01); *H01L 2225/1035* (2013.01); *H01L 2225/1058* (2013.01)

(58) Field of Classification Search
CPC .................................................. H01L 23/5386
See application file for complete search history.

(56) References Cited

U.S. PATENT DOCUMENTS 3,821,463 A * 6/1974 Bakker ................ H05K 9/0041
174/392
8,361,842 B2 1/2013 Yu et al.
(Continued)

*Primary Examiner* — William Harriston
(74) *Attorney, Agent, or Firm* — Slater Matsil, LLP

(57) ABSTRACT

An embodiment device includes an integrated circuit die and a first metallization pattern over the integrated circuit die. The first metallization pattern includes a first dummy pattern having a first hole extending through a first conductive region. The device further includes a second metallization pattern over the first metallization pattern. The second metallization pattern includes a second dummy pattern having a second hole extending through a second conductive region. The second hole is arranged projectively overlapping a portion of the first hole and a portion of the first conductive region.

20 Claims, 20 Drawing Sheets

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2006/0221591 A1* | 10/2006 | Kong ............... H05K 1/0218 361/818 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264839 A1 | 9/2014 | Tsai et al. |
| 2014/0264930 A1 | 9/2014 | Yu et al. |
| 2015/0279788 A1 | 10/2015 | Uchiyama et al. |

* cited by examiner

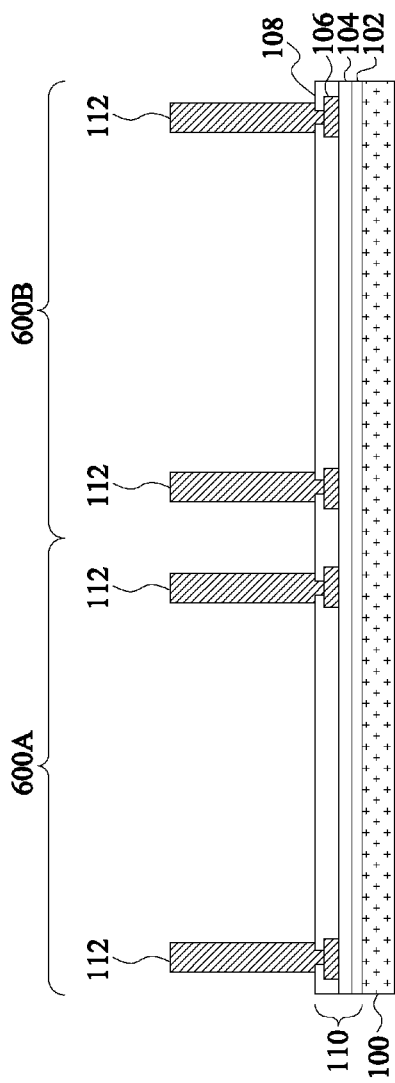
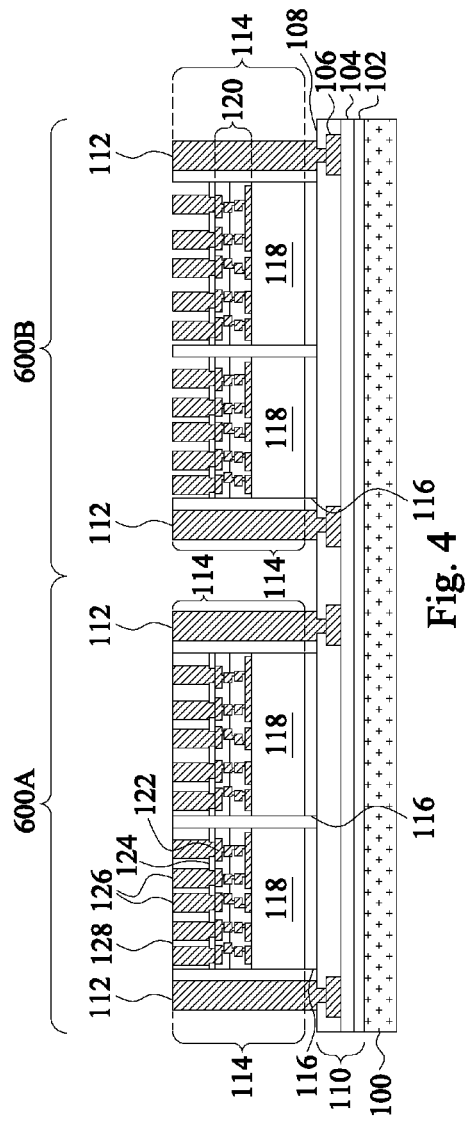

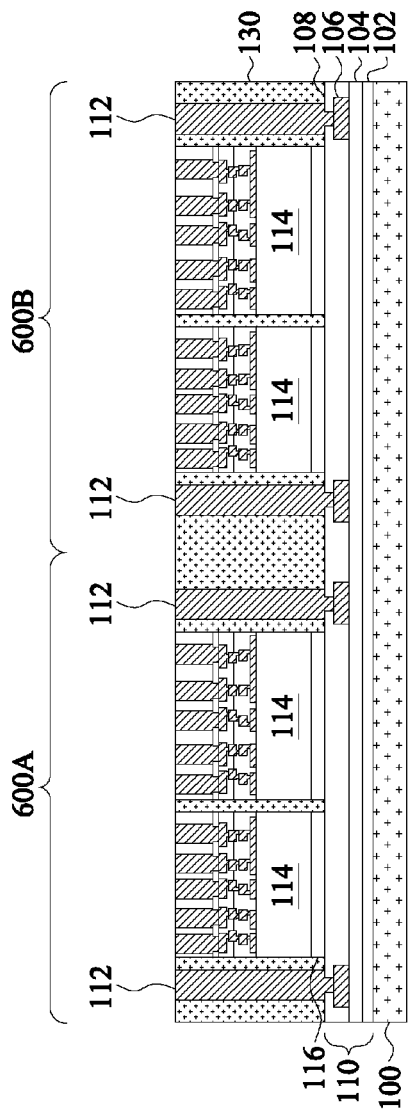
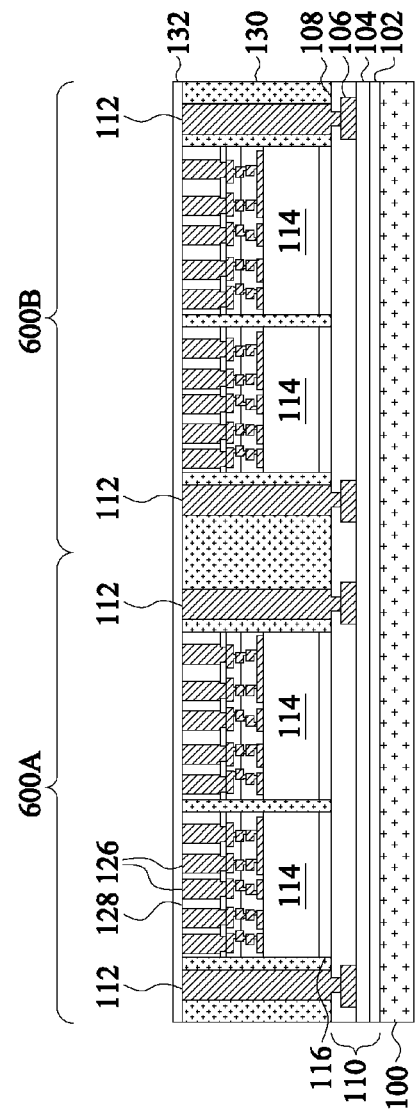
Fig. 5
Fig. 6

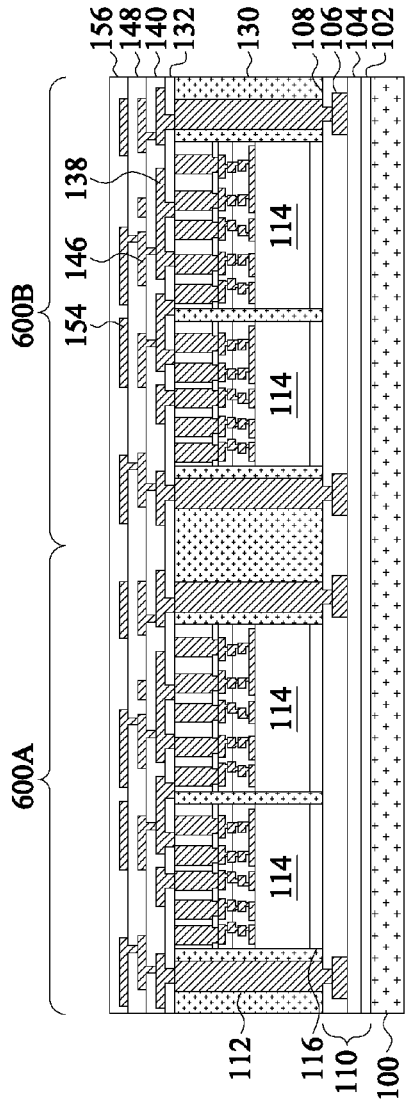
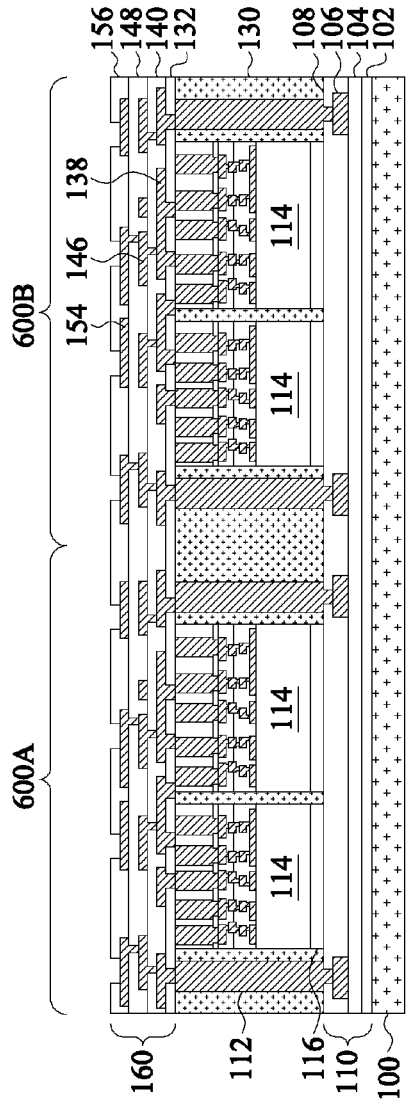
Fig. 15
Fig. 16

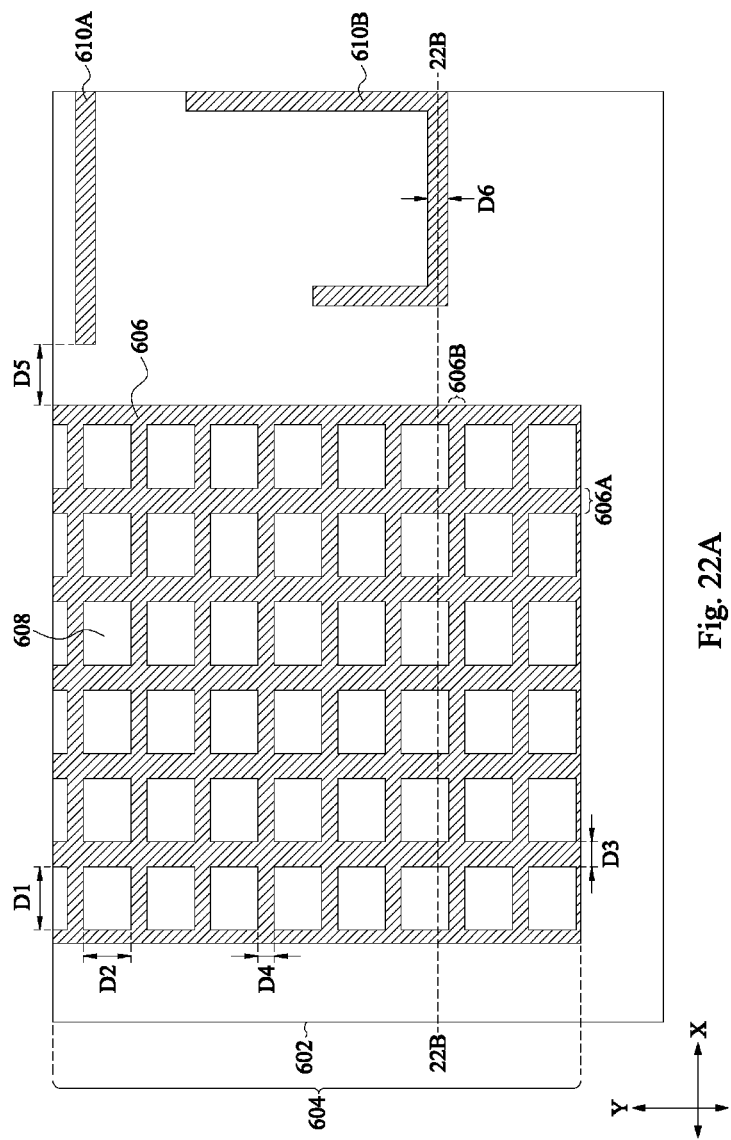

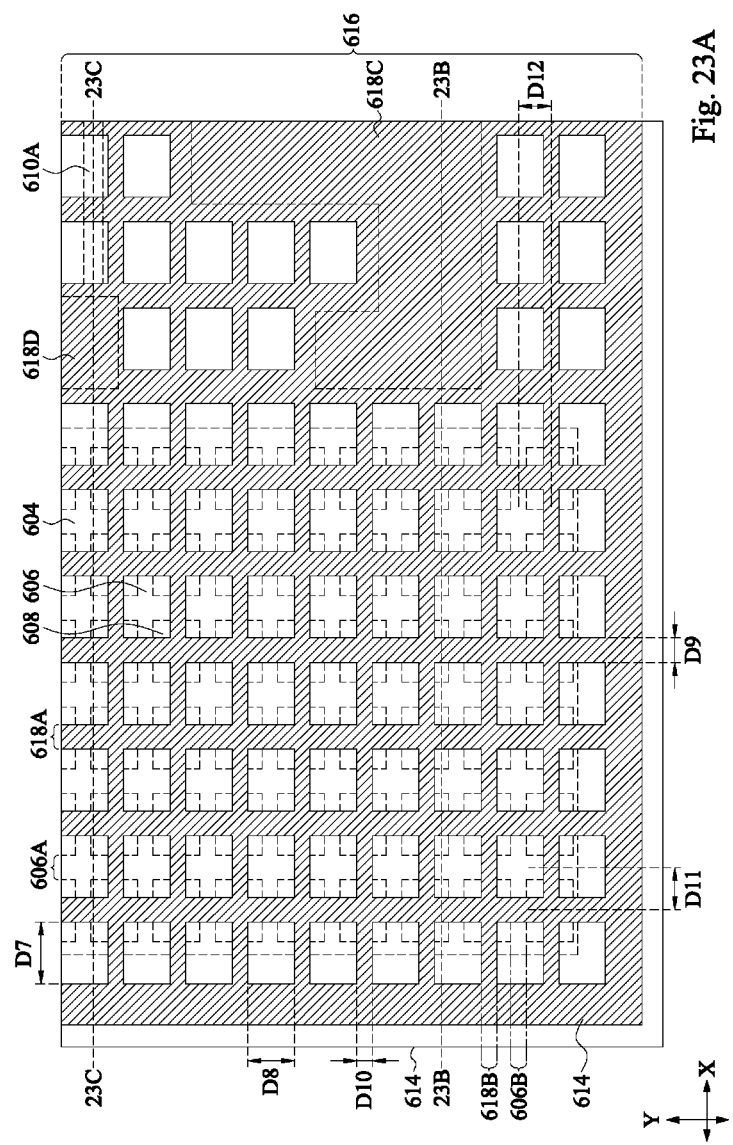

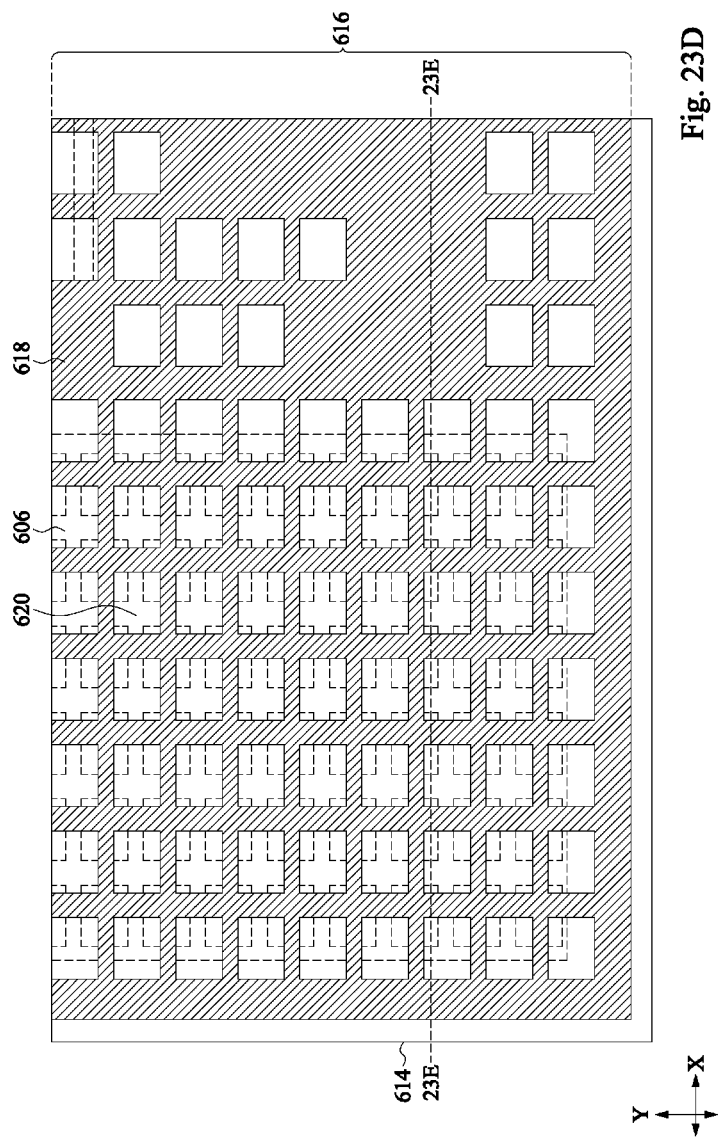

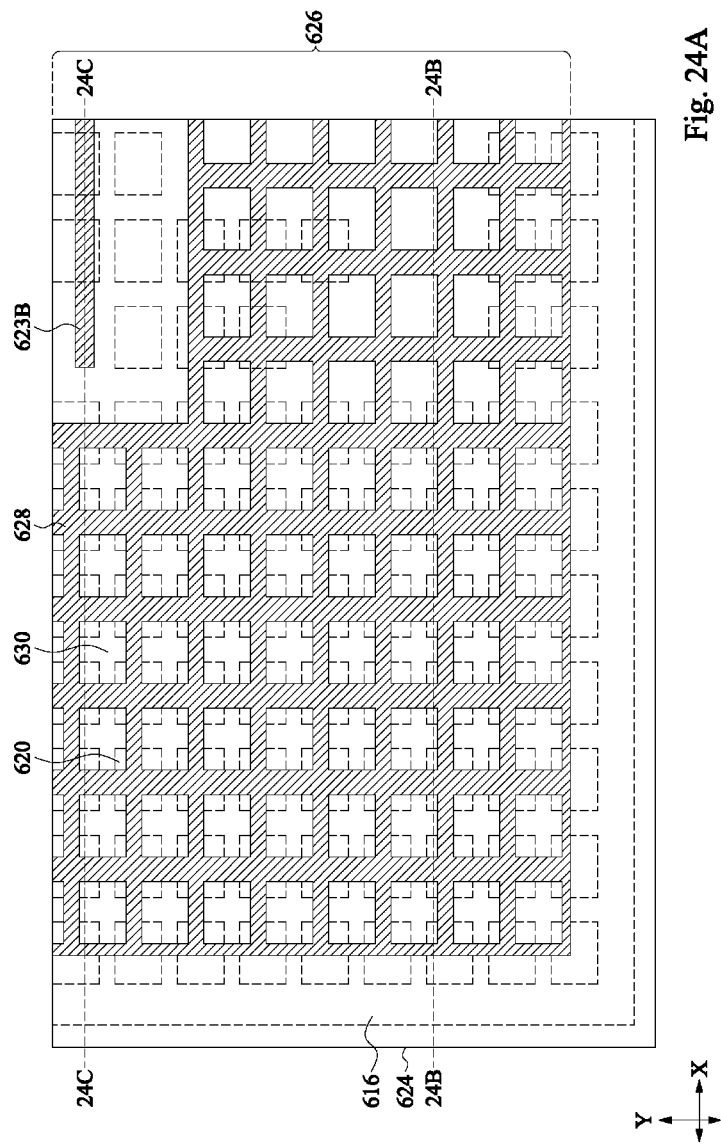

DUMMY FEATURES IN REDISTRIBUTION LAYERS (RDLS) AND METHODS OF FORMING SAME

PRIORITY CLAIM AND CROSS-REFERENCE

This application claims the benefits of U.S. Provisional Application Ser. No. 62/329,823, filed on Apr. 29, 2016, which application is hereby incorporated herein by reference in its entirety.

BACKGROUND

In an aspect of packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs may include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 21 illustrate cross-sectional views of intermediate steps during a process for forming a package structure in accordance with some embodiments.

FIGS. 22A-22B, 23A-23E, and 24A-24C illustrate varying views of metallization patterns in accordance with some embodiments.

DETAILED DESCRIPTION

Figure 1:
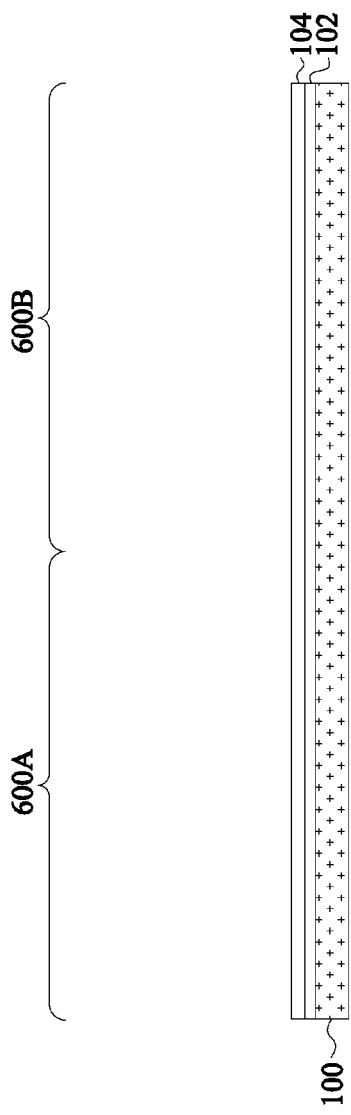

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in a particular context, namely, an integrated fan-out (InFO) package having a particular configuration. Various embodiments may also be applied, however, to other semiconductor devices, such as, devices having stacked layers of metallization patterns disposed in a dielectric material.

FIGS. 1 through 21 illustrate cross-sectional views of intermediate steps during a process for forming a first package structure in accordance with some embodiments. FIG. 1 illustrates a carrier substrate 100 and a release layer 102 formed on the carrier substrate 100. A first package region 600A and a second package region 600B for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 2:
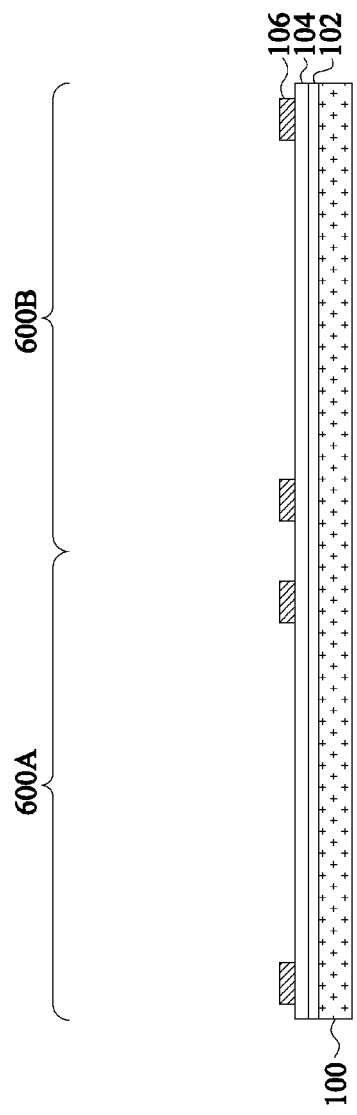

As illustrated in FIG. 2, the dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

In FIG. 2, metallization patterns 106 are formed. The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106. The metallization pattern 106 may include signal lines (e.g., for power, ground, and/or electrical signals to the integrated circuit dies 114) as well as dummy patterns formed to fill spaces between the signal lines as explained in greater detail below with respect to FIGS. 22-23.

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure. As illustrated, the back-side redistribution structure includes the two dielectric layers 104 and 108 and one metallization pattern 106. In other embodiments, the back-side redistribution structure can include any number of dielectric layers, metallization patterns, and vias. One or more additional metallization pattern and dielectric layer may be formed in the back-side redistribution structure by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

In FIG. 4, integrated circuit dies 114 are adhered to the dielectric layer 108 by an adhesive 116. As illustrated in FIG. 4, two integrated circuit dies 114 are adhered in each of the first package region 600A and the second package region 600B, and in other embodiments, more or less integrated circuit dies may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes, and in other embodiments, the integrated circuit dies 114 may be the same size.

Before being adhered to the dielectric layer 108, the integrated circuit dies 114 may be processed according to applicable manufacturing processes to form integrated circuits in the integrated circuit dies 114. For example, the integrated circuit dies 114 each comprise a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally co-terminus with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are co-planar after the grinding process. In some embodiments, the grinding may be omitted, for example, if through vias 112 and die connectors 126 are already exposed.

In FIGS. 6 through 16, a front-side redistribution structure 160 is formed. As will be illustrated in FIG. 16, the front-side redistribution structure 160 includes dielectric layers 132, 140, 148, and 156 and metallization patterns 138, 146, and 154.

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
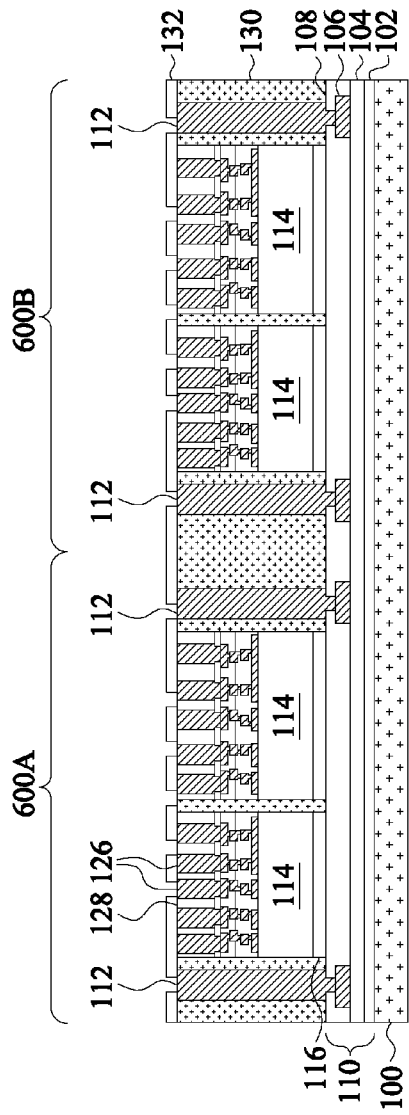

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
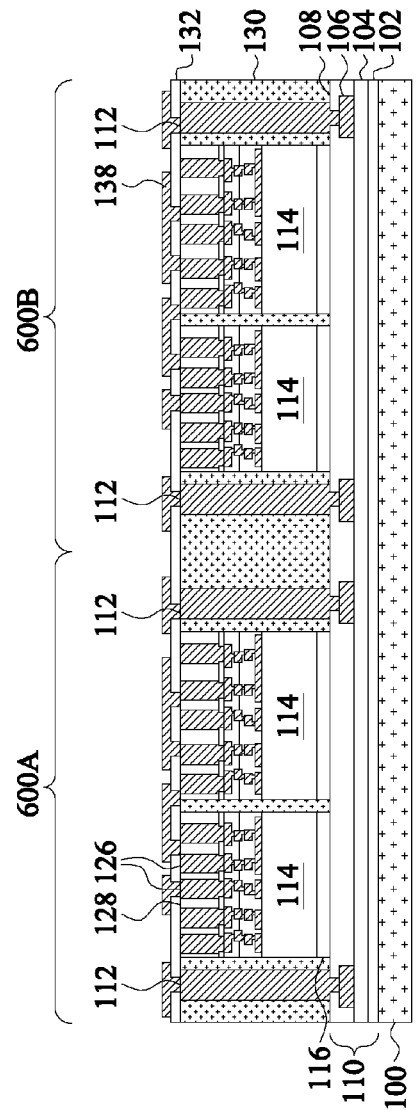

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

The metallization pattern 138 may include signal lines (e.g., for power, ground, and/or electrical signals to the integrated circuit dies 114) as well as dummy patterns formed to fill spaces between the signal lines as explained in greater detail below with respect to FIGS. 22-23.

Figure 9:
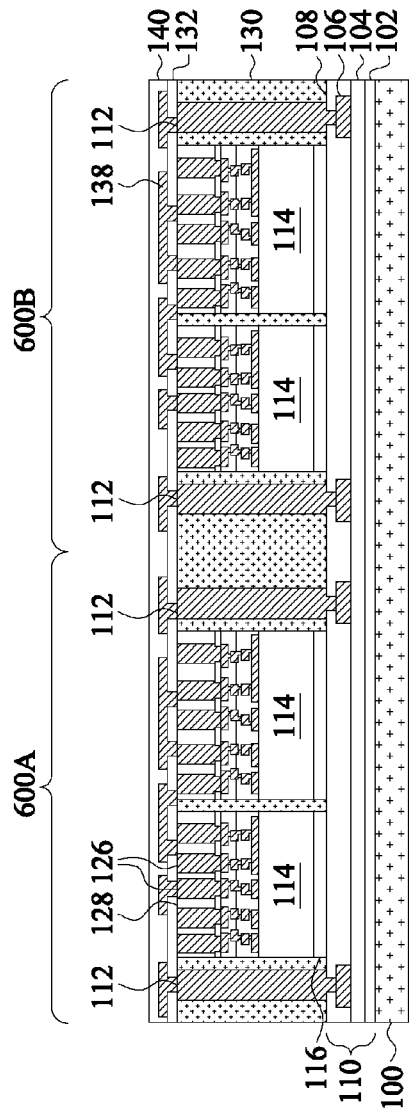

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
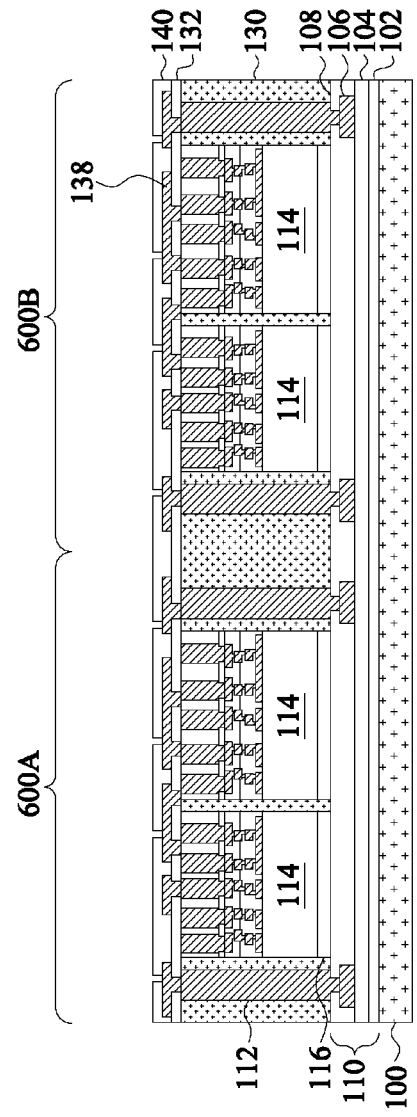

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
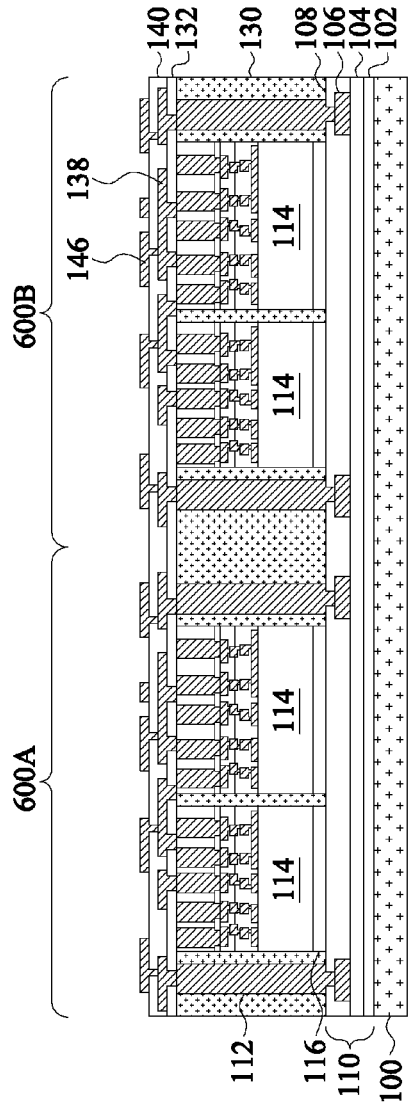

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138. The metallization pattern 146 may include signal lines (e.g., for power, ground, and/or electrical signals to the integrated circuit dies 114) as well as dummy patterns formed to fill spaces between the signal lines as explained in greater detail below with respect to FIGS. 22-23.

Figure 12:
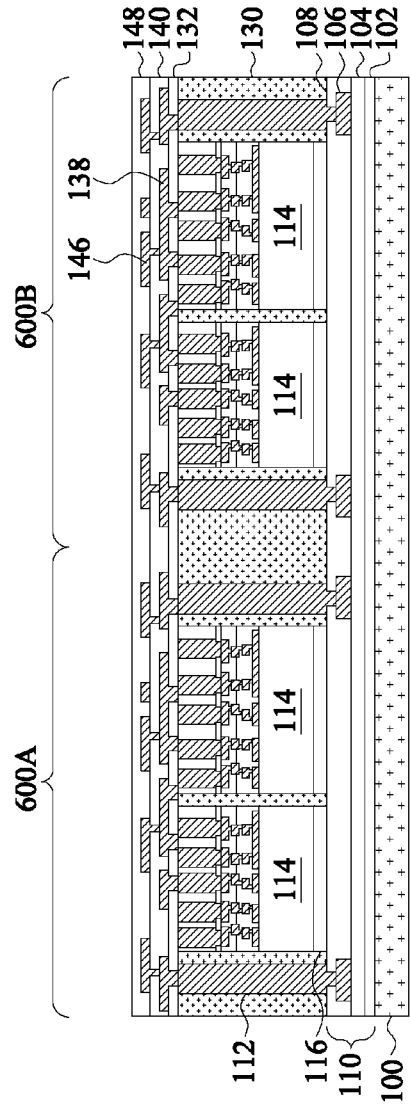

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
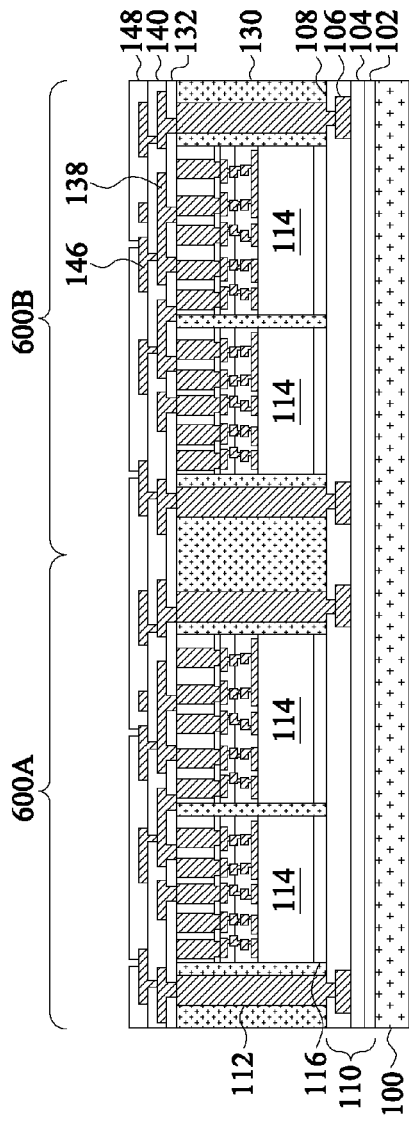

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
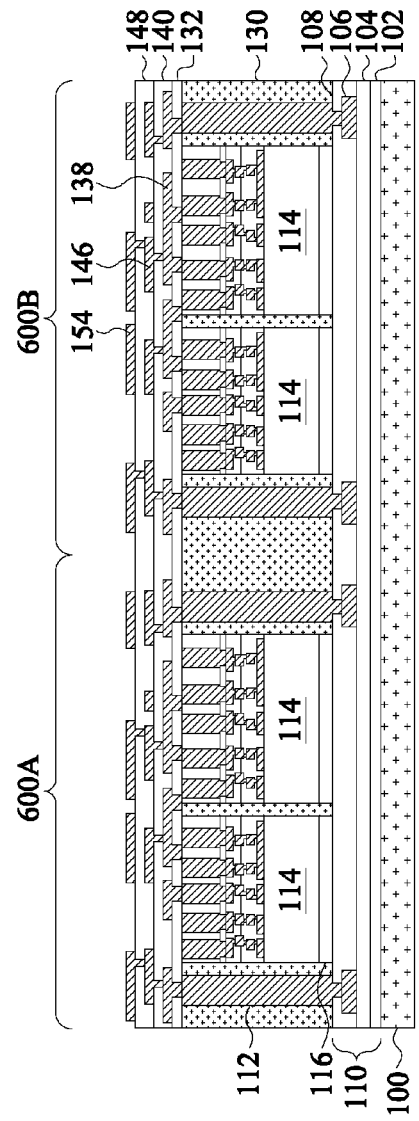

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146. The metallization pattern 154 may include signal lines (e.g., for power, ground, and/or electrical signals to the integrated circuit dies 114) as well as dummy patterns formed to fill spaces between the signal lines as explained in greater detail below with respect to FIGS. 22-23.

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

In FIG. 16, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
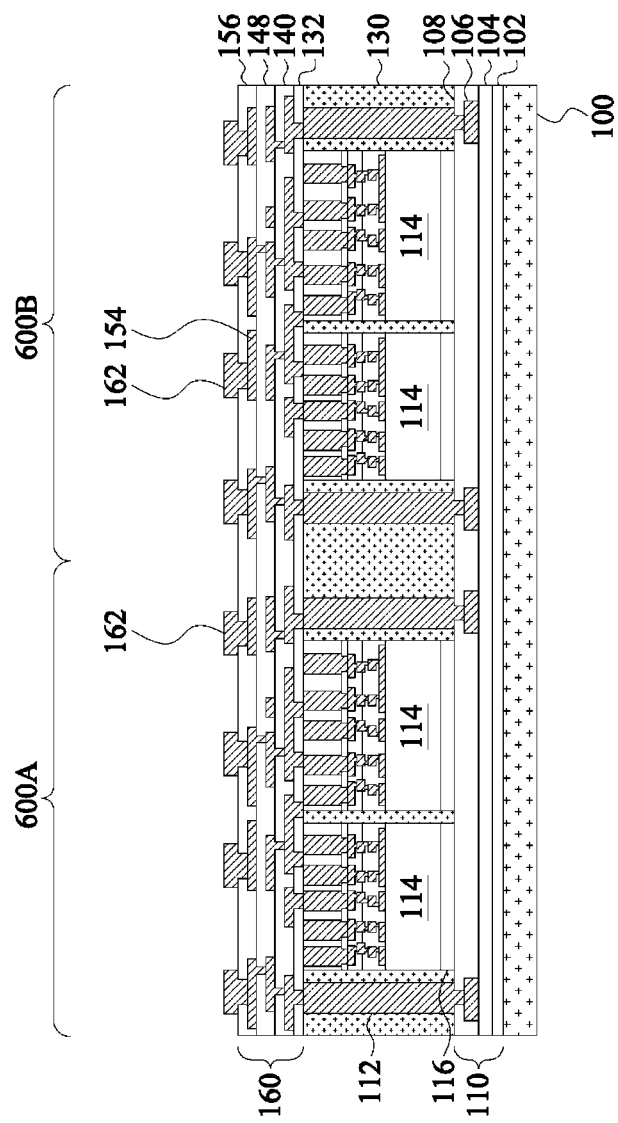

In FIG. 17, pads 162 are formed on an exterior side of the front-side redistribution structure 160. The pads 162 are used to couple to conductive connectors 166 (see FIG. 18) and may be referred to as under bump metallurgies (UBMs) 162. In the illustrated embodiment, pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162.

Figure 18:
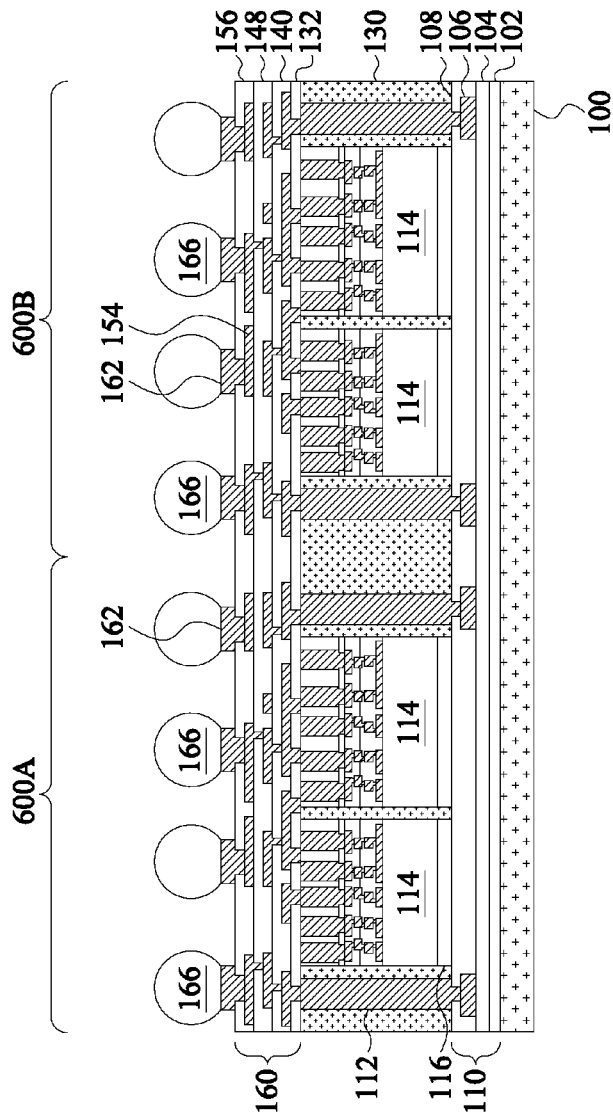

In FIG. 18, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 166. The metal cap layer may include nickel, tin, tin-lead, gold, silver, palladium, indium, nickel-palladium-gold, nickel-gold, the like, or a combination thereof and may be formed by a plating process.

Figure 19:
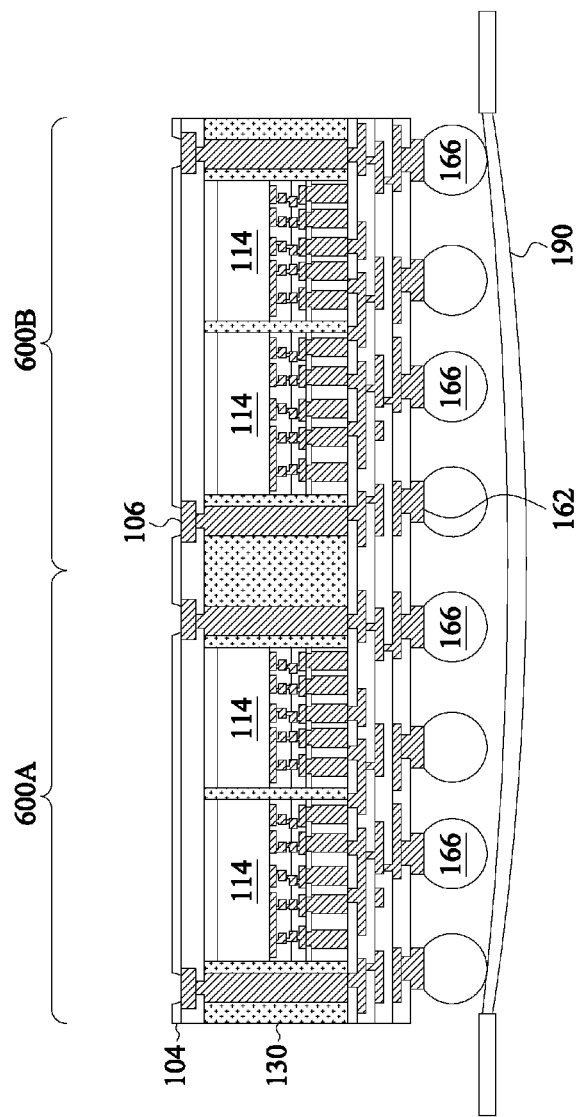

In FIG. 19, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is also flipped over and placed on a tape 190.

As further illustrated in FIG. 19, openings are formed through the dielectric layer 104 to expose portions of the metallization pattern 106. The openings may be formed, for example, using laser drilling, etching, or the like.

Figure 20:
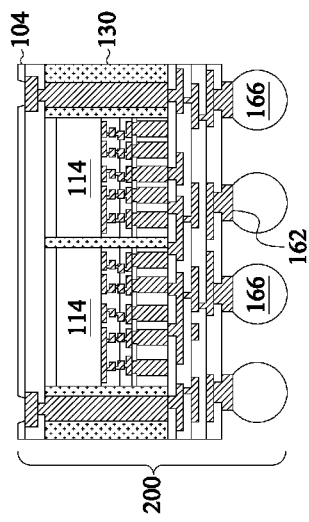

FIG. 20 illustrates a resulting, singulated package 200 after a singulation process is performed by sawing along scribe line regions e.g., between adjacent regions 600A and 600B. The sawing singulates the first package region 600A from the second package region 600B. The singulation results in package 200, which may be from one of the first package region 600A or the second package region 600B, being singulated. The package 200 may also be referred to as an integrated fan-out (InFO) package 200.

Figure 21:
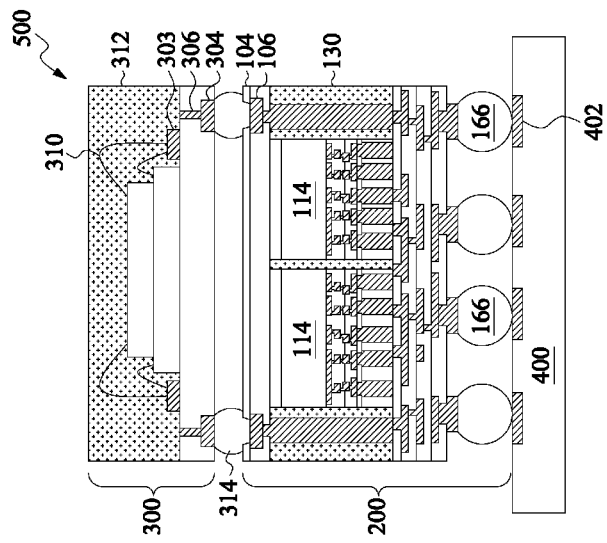

FIG. 21 illustrates a package 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an intermetallization compound (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The package 300 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

As discussed above, any of the metallization patterns within various RDLs (e.g., 106, 138, 146, and/or 154) may include signal lines (e.g., providing power, ground, and/or electrical routing to the integrated circuit dies 114) as well as dummy patterns between and among the signal lines. Generally, the term "dummy pattern" refers to conductive features included for reasons other than electrical routing. For example, in an embodiment, the dummy patterns are electrically insulated from other conductive features in the package, and the dummy patterns are not electrically connected to any active devices. In other embodiments, a conductive via, such as, a conductive via connecting signal lines in layers above and below the dummy pattern, may extend through the dummy pattern, and the dummy pattern may be electrically connected to signal lines in other layers. However, in such embodiments, the dummy pattern may not provide any electrical routing for features (e.g., signal lines) within the layer in which the dummy pattern is disposed.

The dummy patterns may be included to provide a more uniform metallization pattern to improve the planarity of various dielectric layers in which respective the metallization patterns 106, 138, 146, and/or 154 are disposed. In various embodiments, the dummy patterns may be formed and patterned during the formation of various signal lines using any suitable process, such as those described above. Thus, additional process costs to form dummy patterns may be reduced. In other embodiments, the dummy pattern and the signal lines may be formed separately (e.g., the dummy pattern and the signal lines may be formed sequentially in any suitable order) and/or using a different process (e.g., the dummy pattern may be formed by depositing a conductive layer and subsequently etching openings through the conductive layer).

Because the dummy patterns and the signal lines within a metallization pattern may be formed simultaneously, the material of the dummy patterns and the signal lines may also be the same. In various embodiments the dummy patterns comprise holes extending through a conductive material of the dummy pattern. For example, the dummy patterns may include mesh grids having holes disposed in a grid of rows and columns. The holes in the dummy patterns may be included to reduce stress induced by the metallization patterns in various dielectric layers of the resulting package. For example, in some embodiments, a total surface area of holes in a dummy pattern may be at least about 30% to about 40% of a total surface of the dummy pattern. It has been observed by including holes having the above areas, stress may be reduced to a suitable level. Thus, manufacturing defects may be reduced and package reliability may be improved. In other embodiments, the holes may occupy a different surface area percentage in relation to a surface area the entire dummy pattern.

FIGS. 22A, 22B, 23A, 23B, 23C, 23D, 23E, 24A, and 24B illustrate varying views of example metallization patterns, which includes dummy patterns and signal lines. The specific configuration of the metallization pattern provided is for example only, and other configurations may be used in various embodiments.

Figure 22B:
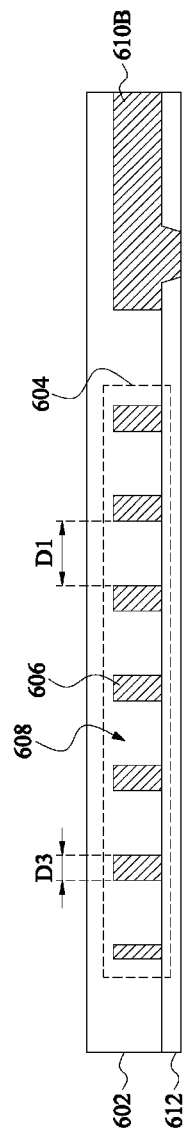

Referring first to FIGS. 22A and 22B, FIGS. 22A and 22B illustrate varying view of a portion of a dummy pattern 604, which is disposed in a dielectric layer 602. FIG. 22A illustrates a top-down view while FIG. 22B illustrates a corresponding cross-sectional view taken across the line 22B-22B of FIG. 22A. The dummy pattern 604 includes a plurality of holes 608 extending through a conductive material 606 of the dummy pattern 604. The holes 608 may be arranged in a grid of rows and columns, and each row and column in the array may include a same number or a different number of the holes 608. Each of the holes 608 may be filled with a portion of the dielectric layer 602. In a top down view of the dummy pattern 604, each of the holes 608 may be configured as a dimension D1 by a dimension D2 rectangle. For example, the dimension D1 may be a length (or width) of the rectangle taken along a first direction while the dimension D2 may be a width (or length) of the rectangle taken along a second direction different than the first direction. In some embodiments, the dimension D1 is about 10 μm to about 30 μm, and the dimension D2 is about 10 μm to about 30 μm. In other embodiments, the dimension D1 and/or the dimension D2 may have different values.

When the holes 608 have a substantially rectangular planar profile (e.g., profile of holes 608 in a planar view), an area of the holes 608 in a top-down view may be maximized within a particular spacing restraint of the resulting device (e.g., a particular critical dimension for a given technology node). By maximizing an area of each hole 608, the stress reduction properties of the holes 608 on the dummy pattern 604 may be increased. In other embodiments, a shape of the holes 608 may be different (e.g., circular, ovular, or any other suitable shape).

The conductive material 606 may be disposed in a pattern of multiple columns and rows, thereby defining a plurality of holes 608 there-between. Throughout the description, portions of the conductive material 606 disposed around the holes 608 may also be referred to as dummy lines, such as dummy lines 606A and dummy lines 606B. In the illustrated orientation of FIG. 22A, the dummy lines 606A have lengthwise dimensions running in a direction parallel to a y-axis while the dummy lines 606B have lengthwise dimensions running in a direction orthogonal to the dummy lines 606A and parallel to an x-axis. The dummy lines 606A and 606B bound each of the holes 608 on four-sides. For example, the dummy lines 606A separate adjacent holes 608 in a same row and different columns while the dummy lines 606B separate adjacent holes 608 in a same column and different rows. The dummy lines 606A have a dimension D3, which also denotes the distance between adjacent holes 608 in different columns. The dummy lines 606B have a dimension D4, which also denotes the distance between adjacent holes 608 in different rows. In various embodiments, the dimension D3 and the dimension D4 may be the same or different. Furthermore, the dimension D3 and the dimension D4 may each be equal to or greater than a minimum line-width for a particular technology node. For example, the dimension D3 may be about 5 μm to about 50 μm, and the dimension D4 may be about 5 μm to about 50 μm. In other embodiments the dimension D3 and/or the dimension D4 may have other values.

As further illustrated by FIGS. 22A and 22B, signal lines (e.g., signal lines 610A and 610B) may also be disposed in the dielectric layer 602. The signal lines 610A and 610B may be electrically connected to electrical circuitry and active devices in other package features (e.g., electrical circuitry and/or active devices in the integrated circuit dies 114, see FIG. 21). For example, as illustrated by FIG. 22B, the signal line 610B is electrically connected to a via extending through a dielectric layer 612 underlying the dielectric layer 602. The signal lines 610A and 610B may be used to provide power, ground, and/or electrical routing in the completed package (e.g., package 500, see FIG. 21).

Referring back to FIG. 22A, the signal lines 610A and 610B may be spaced apart from the dummy pattern 604 by at least a minimum spacing, which may be a minimum spacing designated by a layout designer between active and dummy features to avoid interference (e.g., signal and/or manufacturing interference) between the dummy pattern 604 and the signal lines 610A and 610B. For example, signal line 610A is disposed apart from the dummy pattern 604 by a distance D5, which may be about 5 µm to about 20 µm in some embodiments. In other embodiments, distance D5 may have a different value. Furthermore, signal lines 610A and 610B may have a dimension D6 (e.g., a line width), which may be equal to or greater than a minimum line-width for a particular technology node. For example, the dimension D6 may be about 5 µm to about 50 µm. In other embodiments the dimension D6 may have another value.

Figure 23B:
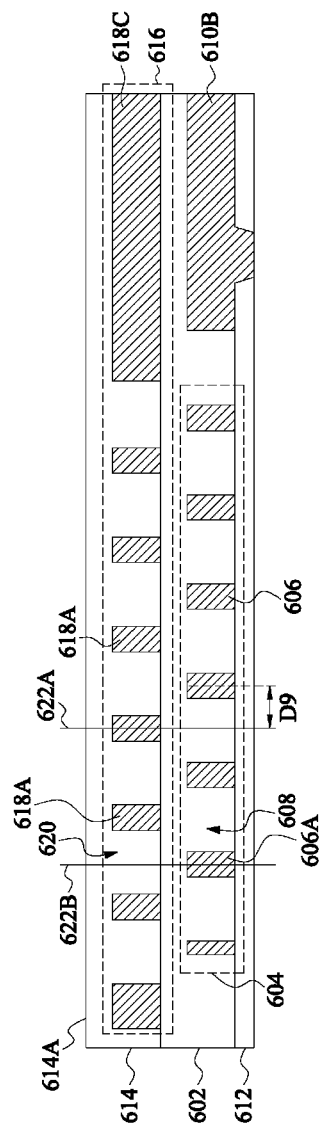
Figure 23C:
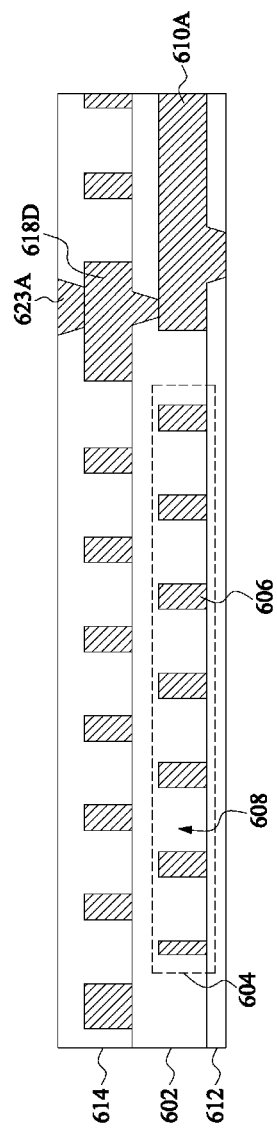

FIGS. 23A, 23B, and 23C illustrate varying views of a portion of a dummy pattern 616, which is disposed in a dielectric layer 614 over the dielectric layer 602 and the dummy pattern 604. FIG. 23A illustrates a top-down view while FIGS. 23B and 23C illustrate a corresponding cross-sectional view taken across the line 23B-23B and the line 23C-23C of FIG. 23A, respectively. In FIG. 23A, the metallization pattern (e.g., the dummy pattern 604 and the signal line 610A) in the dielectric layer 602 (see FIG. 22A) is shown in ghost for reference.

The dummy pattern 616 includes a plurality of holes 620 extending through a conductive material 618 of the dummy pattern 604. Each of the holes 620 may be filled with a portion of the dielectric layer 614. The holes 620 may be arranged in a grid of rows and columns, and each row and column in the array may include a same number or a different number of the holes 620. For example, as illustrated by FIG. 23A, holes 620 may be omitted from certain rows/columns of the dummy pattern 616 to provide regions 618C and 618D of the conductive material 618 having no holes 620 disposed therein. The regions 618C and 618D may have a surface area that is at least as large as one of the holes 620. The locations of the regions 618C and 618D may be selected based on a metallization pattern underlying the dummy pattern 616. For example, referring to FIG. 23B, the region 618C is directly over and overlaps the underlying signal line 610B. By including the solid conductive region 618C over the signal line 610B, the region 618C may be advantageously used for electromagnetic (EM) shielding of the underlying signal line. In an embodiment, the conductive material 618 completely covers an entirety of underlying signal line 610B. As another example, referring to FIG. 23C, the region 618D is disposed over a portion of the underlying signal line 610A, and a via 623A extends through the region 618D. Thus, the region 618D allows via 623A to electrically connect the signal line 610A to an overlying electrical signal (e.g., a power line, a ground line, or an electrical routing line), such as signal line 623B in FIG. 24C.

Referring back to the top down view of FIG. 23A, each of the holes 620 may be configured as a dimension D7 by a dimension D8 rectangle. For example, the dimension D7 may be a length (or width) of the rectangle measured along a first direction while the dimension D8 may be a width (or length) of the rectangle measured along a second direction different than the first direction. In some embodiments, the dimension D7 is about 10 µm to about 30 µm, and the dimension D8 is about 10 µm to about 30 µm. In other embodiments, the holes 620 may have a different size and/or shape, which may be the same or different as the size and/or shape of the holes 608 in the dummy pattern 604.

The conductive material 618 may be disposed between adjacent holes 620. Throughout the description, portions of the conductive material 618 disposed around the holes 620 may also be referred to as dummy lines, such as dummy lines 618A and 618B. In the illustrated orientation of FIG. 23A, the dummy lines 618A have lengthwise dimensions running in a direction parallel to a y-axis while the dummy lines 618B have lengthwise dimensions running in a direction orthogonal to the dummy lines 618A and parallel to an x-axis. The dummy lines 618A and 618B bound each of the holes 620 on four-sides. For example, the dummy lines 618A separate adjacent holes 620 in a same row and different columns while the dummy lines 618B separate adjacent holes 620 in a same column and different rows. The dummy lines 618A have a dimension D9, which also denotes the distance between adjacent holes 620 in different columns. The dummy lines 618B have a dimension D10, which also denotes the distance between adjacent holes 620 in different rows. In various embodiments, the dimension D9 and the dimension D10 may be the same or different. Furthermore, the dimension D9 and the dimension D10 may each be equal to or greater than a minimum line-width for a particular technology node. For example, the dimension D9 may be about 5 µm to about 50 µm, and the dimension D10 may be about 5 µm to about 50 µm. In other embodiments, the dimension D9 and/or the dimension D10 may have other values.

Figure 23E:
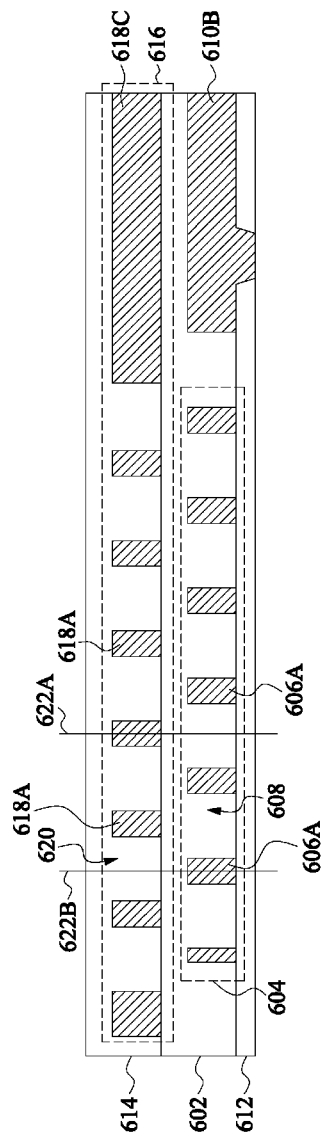

Furthermore, the mesh grid of the dummy pattern 616 is offset from the mesh grid of the dummy pattern 604. For example, in areas where the dummy patterns 604 and 616 overlap, the holes 620 of the dummy pattern 616 are offset from the holes 608 of the dummy pattern 604, and the holes 620 of the dummy pattern 616 are disposed directly over at least a portion of the conductive material 606 of the dummy pattern 604. Put another way, the holes 620 defined by dummy pattern 616 projectively overlaps at least a portion of the conductive material 606 of the dummy pattern 604. Referring to FIG. 23B, a line 622A perpendicular to a major surface 614A of the dielectric layer 614 and extending through a center of a dummy line 618A may also extend through a hole 608 directly underlying the dummy line 618A. As another example, a line 622B perpendicular to the major surface 614A of the dielectric layer 614 and extending through a center of a dummy line 606A may also extend through a hole 620 projectively overlying the dummy line 606A. In some embodiments, the lines 622A and 622B extend through respective centers of the holes 608 and 620. In other embodiments (e.g., as illustrated by FIGS. 23D and 23E), the lines 622A and 622B may not extend through respective centers of the holes 608 and 620.

Furthermore, referring back to FIG. 23A, centers of the dummy lines 618A may be spaced apart from centers of respective closest dummy lines 606A by a non-zero dimension D11 in a first direction (e.g., a direction along the x-axis), and centers of the dummy lines 618B may be spaced apart from centers of respective closest dummy lines 606B by a non-zero dimension D12 in a second direction (e.g., a direction along the y-axis). In an embodiment, the dimension D11 may be greater than about half of the dimension D7 of a hole 620 measured along the first direction (e.g., the direction along the x-axis). For example, the dimension D11 may be greater than about 5 µm when the dimension D7 is about 10 µm. Furthermore, the dimension D12 may be greater than about half of the dimension D8 of a hole 620 measured along the second direction (e.g., the direction along the y-axis). For example, the dimension D12 may be greater than about 5 µm when the dimension D8 is about 10 µm. It has been observed that when the dimensions D7, D8, D11, and D12 have the above relationship and/or values, the planarity of the dielectric layer 614 and overlying dielectric layers (e.g., dielectric layer 624, see FIG. 24B) may be improved. In other embodiments the dimension D11 and/or the dimension D12 may have other values.

Figure 24B:
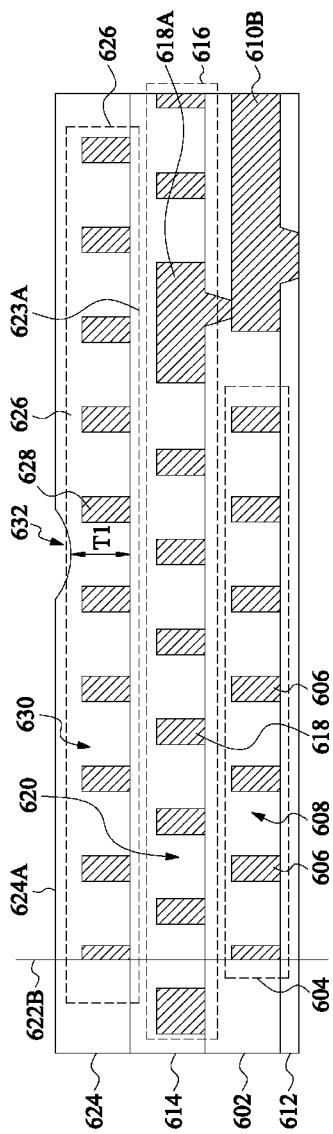
Figure 24C:
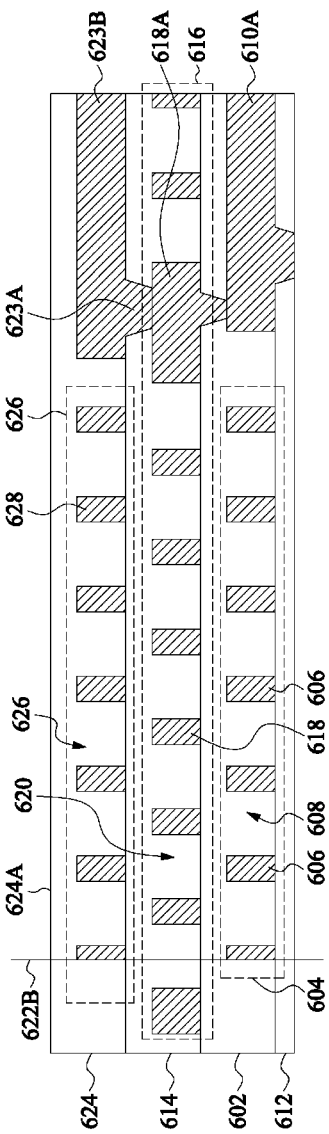

FIGS. 24A, 24B, and 24C illustrate varying views of a portion of a dummy pattern 626, which is disposed in a dielectric layer 624 over the dielectric layer 614 and the dummy pattern 616. FIG. 24A illustrates a top-down view while FIGS. 24B and 24C illustrate a corresponding cross-sectional view taken across the line 24B-24B and the line 24C-24C of FIG. 24A, respectively. In FIG. 24A, the metallization pattern (e.g., the dummy pattern 616) in the dielectric layer 614 (see FIG. 23A) is shown in ghost for reference.

The dummy pattern 626 may be similar to the dummy patterns 616 and 604 (see FIG. 22A). For example, the dummy pattern 626 includes a plurality of holes 630 extending through a conductive material 628 of the dummy pattern 626. Each of the holes 630 may be filled with a portion of the dielectric layer 624. The holes 630 may be arranged in a grid of rows and columns, and each row and column in the array may include a same number or a different number of the holes 630. A shape and/or dimension of the holes 630 may be the same or different than corresponding shapes and/or dimensions of holes 620 (see FIG. 23A) and 608 (see FIG. 22A) As illustrated by FIG. 24A, the holes 630 may be offset and misaligned from the holes 620 of the dummy pattern 616 in a dielectric layer (e.g., dielectric layer 614) immediately underlying dielectric layer 624. In some embodiments as illustrated by FIG. 24B, the dummy pattern 626 may be aligned with the dummy pattern 604. For example, sidewalls of holes 630 may be aligned with sidewalls of holes 608 in the dummy pattern 604. In other embodiments, the dummy pattern 626 may be offset and misaligned with the dummy pattern 604, and the holes 630 may be offset from the holes 608. Furthermore, in some embodiments (e.g., as illustrated by FIG. 24C), a via 623A may extend through the dummy pattern 616 to electrically connect a signal line 623B in the dielectric layer 624 to a signal line 610A in the dielectric layer 602.

It has been observed that by offsetting the holes in dummy patterns in adjacent dielectric layers, the planarity of a top-most dielectric layer (e.g., the dielectric layer 624) may be improved. For example, in an embodiment, a top surface 624A (see FIGS. 24B and 24C) the dielectric layer 624 may be substantially level. Even in instances where the top surface 624A includes valleys (e.g., valley 632, see FIG. 24B), a minimum thickness T1 of the dielectric layer 624 is still sufficient to cover the conductive features in the dielectric layer 624. Thus, by staggering mesh grids of dummy patterns in various dielectric layers of RDLs, manufacturing defects can be reduced while still providing dummy patterns for improved planarity and holes in the dummy patterns for reduced stress.

In accordance with an embodiment, a device includes an integrated circuit die and a first metallization pattern over the integrated circuit die. The first metallization pattern includes a first dummy pattern defining a first hole extending through a first conductive region. The device further includes a second metallization pattern over the first metallization pattern. The second metallization pattern includes a second dummy pattern defining a second hole extending through a second conductive region. The second hole projectively overlaps a portion of the first hole and a portion of the first conductive region In accordance with another embodiment, a package includes an integrated circuit die, an encapsulant extending along sidewalls of the integrated circuit die, a through via extending through the encapsulant and electrically connected to the integrated circuit die, and a first dielectric layer over the integrated circuit die and the encapsulant. The package further includes a first dummy pattern in the first dielectric layer. The first dummy pattern includes a first conductive material and a plurality of first holes extending through the first conductive material and disposed in a first grid of first rows and columns. The package also includes a second dielectric layer over the first dielectric layer and a second dummy pattern in the second dielectric layer. The second dummy pattern includes a second conductive material and a plurality of second holes extending through the second conductive material and disposed in a second grid of second rows and columns. The second grid is offset from the first grid.

In accordance with yet another embodiment, a method includes encapsulating an integrated circuit die in an encapsulant, depositing a first dielectric layer over the integrated circuit die and the encapsulant, and forming a first metallization pattern over the first dielectric layer. The first metallization pattern includes a first dummy pattern and a first signal line electrically connected to the integrated circuit die. The first dummy pattern includes first holes extending through a first conductive material. The first conductive material includes a first dummy line disposed between adjacent ones of the first holes. The method also includes depositing a second dielectric layer over the first dielectric layer and the first metallization pattern. The method also includes forming a second metallization pattern over the second dielectric layer. The second metallization pattern includes a second dummy pattern having second holes extending through a second conductive material. A line perpendicular to a major surface of the second dielectric layer extends through a first one of the second holes and the first dummy line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an integrated circuit die;
   a first insulating layer over the integrated circuit die;
   a first metallization pattern in the first insulating layer over the integrated circuit die, wherein the first metallization pattern comprises:
      a first dummy pattern defining a first hole extending through a first conductive region; and
      a first signal line electrically connected to the integrated circuit die;
   a second insulating layer over the first insulating layer and the first metallization pattern; and
   a second metallization pattern in the second insulating layer over the first metallization pattern, wherein the second metallization pattern comprises a second dummy pattern defining a second hole extending through a second conductive region, and wherein the second hole projectively overlaps a portion of the first hole and a portion of the first conductive region.

2. The device of claim 1, wherein the first conductive region comprises a dummy line bounding a side of the first hole, and wherein a line extending through a center of the dummy line also extends through a center of the second hole in a cross-sectional view of the device.

3. The device of claim 1, wherein the first conductive region comprises a dummy line bounding a side of the first hole, and wherein a line extending through a center of the dummy line does not extend through a center of the second hole in a cross-sectional view of the device.

4. The device of claim 1, further comprising a via extending through the second metallization pattern, wherein the via electrically connects the first signal line to a second signal line disposed over the second metallization pattern.

5. The device of claim 1, wherein the second conductive region completely covers the first signal line.

6. The device of claim 1, wherein the first dummy pattern, the second dummy pattern, or a combination thereof are electrically insulated from any active devices in the integrated circuit die.

7. A package comprising:
an integrated circuit die;
an encapsulant extending along sidewalls of the integrated circuit die;
a through via extending through the encapsulant and electrically connected to the integrated circuit die;
a first dielectric layer over the integrated circuit die and the encapsulant;
a first dummy pattern in the first dielectric layer, wherein the first dummy pattern comprises:
a first conductive material; and
a plurality of first holes extending through the first conductive material and disposed in a first grid of first rows and columns;
a second dielectric layer over the first dielectric layer; and
a second dummy pattern in the second dielectric layer, wherein the second dummy pattern comprises:
a second conductive material; and
a plurality of second holes extending through the second conductive material and disposed in a second grid of second rows and columns, wherein the second grid is offset from the first grid.

8. The package of claim 7 further comprising:
a third dielectric layer over the second dielectric layer; and
a third dummy pattern in the third dielectric layer, wherein the third dummy pattern comprises:
a third conductive material; and
a plurality of third holes extending through the third conductive material and disposed in a third grid of third rows and columns, wherein the second grid is offset from the third grid.

9. The package of claim 8, wherein the third grid is substantially aligned with the first grid.

10. The package of claim 7, wherein the second conductive material comprises a region free of any holes, and wherein a surface area of the region is at least as large as a surface area of one of the second holes.

11. The package of claim 10, wherein the region is disposed directly over a first signal line in the first dielectric layer, and wherein the first signal line is electrically connected to an active device in the integrated circuit die.

12. The package of claim 11 further comprising a via extending through the region, wherein the via electrically connects the first signal line to a second signal line in a third dielectric layer over the second dielectric layer.

13. The package of claim 7, wherein the first dummy pattern does not provide electrical routing between features within the first dielectric layer, and wherein the second dummy pattern does not provide electrical routing between features within the second dielectric layer.

14. The package of claim 7, wherein a first line disposed halfway between adjacent ones of the first plurality of holes is spaced apart from a second line disposed halfway between adjacent ones of the second plurality of holes by a first dimension in a first direction, wherein a side of one of the second plurality of holes has a second dimension measured in the first direction, and wherein the first dimension is at least half of the second dimension.

15. A method for forming a package, the method comprising:
encapsulating an integrated circuit die in an encapsulant;
depositing a first dielectric layer over the integrated circuit die and the encapsulant;
forming a first metallization pattern over the first dielectric layer, wherein the first metallization pattern comprises:
a first dummy pattern comprising first holes extending through a first conductive material, wherein the first conductive material comprises a first dummy line disposed between adjacent ones of the first holes; and
a first signal line electrically connected to the integrated circuit die;
depositing a second dielectric layer over the first dielectric layer and the first metallization pattern; and
forming a second metallization pattern over the second dielectric layer, wherein the second metallization pattern comprises a second dummy pattern comprising second holes extending through a second conductive material, wherein a line perpendicular to a major surface of the second dielectric layer extends through a first one of the second holes and the first dummy line.

16. The method of claim 15, wherein the first dummy pattern and the first signal line are formed simultaneously.

17. The method of claim 15, wherein the line extends through a center of the first dummy line and a center of the first one of the second holes in a cross-sectional view of the package.

18. The method of claim 15 further comprising:
depositing a third dielectric layer over the second metallization pattern;
forming a third metallization pattern over the second metallization pattern, wherein the third metallization pattern comprises:
a third dummy pattern comprising third holes extending through a third conductive material, wherein the third conductive material comprises a second dummy line disposed between adjacent ones of the third holes, and wherein the line extends through the second dummy line; and
a second signal line electrically connected to the first signal line.

19. A method of claim 18, wherein forming the third metallization pattern comprises:
patterning an opening in the third dielectric layer to expose a portion of the second dummy pattern electrically connected to the first signal line; and
filling the opening with a conductive material.

20. The method of claim 15, wherein a portion of the second conductive material covers an entirety of the first signal line.

* * * * *